(12) United States Patent
Wang et al.

(10) Patent No.: US 11,119,612 B2
(45) Date of Patent: Sep. 14, 2021

(54) EMBEDDED TOUCH PANEL WITH TOUCH DRIVE LINES STRUCTURE THAT IMPROVES SENSITIVITY

(71) Applicant: WUHAN CHINA STAR OPTOELECTRONICS SEMICONDUCTOR DISPLAY TECHNOLOGY CO., LTD., Hubei (CN)

(72) Inventors: Lei Wang, Hubei (CN); Xiaowen Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 81 days.

(21) Appl. No.: 16/499,273

(22) PCT Filed: Jun. 17, 2019

(86) PCT No.: PCT/CN2019/091513
§ 371 (c)(1),
(2) Date: Sep. 29, 2019

(87) PCT Pub. No.: WO2020/173017
PCT Pub. Date: Sep. 3, 2020

(65) Prior Publication Data
US 2020/0272261 A1    Aug. 27, 2020

(51) Int. Cl.
*G06F 3/044* (2006.01)
*H01L 21/76* (2006.01)
*H01L 29/40* (2006.01)
*H01L 21/28* (2006.01)

(52) U.S. Cl.
CPC .............. *G06F 3/044* (2013.01); *H01L 21/28* (2013.01); *H01L 21/76* (2013.01); *H01L 29/40* (2013.01); *G06F 2203/04103* (2013.01)

(58) Field of Classification Search
CPC ...... G06F 3/044; G06F 3/0445; G06F 3/0447; G06F 2203/04103; H01L 21/28; H01L 21/76; H01L 29/40
See application file for complete search history.

(56) References Cited

U.S. PATENT DOCUMENTS 10,908,723 B2 *  2/2021  Kim .................... G06F 3/044
10,908,756 B2 *  2/2021  Lee .................... H03K 17/9625
(Continued)

*Primary Examiner* — Liliana Cerullo
(74) *Attorney, Agent, or Firm* — Mark M. Friedman

(57) ABSTRACT

An embedded touch panel and a manufacturing method are provided. Touch drive lines of a touch panel adopt a segmented structure design so that spacings between the touch drive lines and the touch sense lines are changed, and changes of the spacings cause changes of capacitance values between the touch drive lines and the touch sense lines. Through detecting an amount of change of the capacitance value, a magnitude of a user's pressing force is determined to make a further judgment as to whether it is a light press or a heavy press so as to retrieve a corresponding instruction. Only four masks are needed to fabricate the structure of the touch circuit lines. The manufacturing process is relatively simple to reduce the manufacturing cost.

16 Claims, 9 Drawing Sheets

(56) References Cited

U.S. PATENT DOCUMENTS

| | | | |
|---|---|---|---|
| 2014/0078106 A1* | 3/2014 | Yao | G06F 3/0443 |
| | | | 345/174 |
| 2014/0168154 A1* | 6/2014 | Wang | G06F 3/0412 |
| | | | 345/174 |
| 2014/0184527 A1* | 7/2014 | Kim | G06F 3/0443 |
| | | | 345/173 |

* cited by examiner

EMBEDDED TOUCH PANEL WITH TOUCH DRIVE LINES STRUCTURE THAT IMPROVES SENSITIVITY

BACKGROUND

1. Field of the Invention

The present disclosure relates to the field of touch panel technology, more particularly, to an embedded touch panel.

2. Description of the Related Art

Touch technology has become the normal practice for the use of mobile phones. Most of the traditional touch technologies are based on add-on technology, and the touch sensors are finally bonded to the panel. Due to the issue of process yield when bonding, the overall cost is high, and the technical trend of mobile phone panels for structural integration requirement is not met. The touch structure technology of display panels is mainly classified into two types: the add-on type and the embedded type. The add-on touch structure is to superimpose one layer of touch panel onto an outside of the display panel, and the embedded touch structure is further classified into the on-cell touch structure and the in-cell touch structure. The on-cell touch structure is to add the touch sensors to an upper surface layer or a lower surface layer of the color filter substrate of the display panel. The in-cell touch structure is to directly dispose the touch sensors in the display unit structure of the display panel. Since the in-cell touch structure has the advantages of higher structural integration, smaller thickness, and lighter weight, etc., as compared with the add-on touch structure and the on-cell touch structure, the in-cell touch structure has become the mainstream touch technology currently applied to smartphones.

However, the in-cell touch structure in the related art mainly adopts the method in which touch drive lines (Tx line) and touch sense lines (Rx line) disposed on different layers are perpendicularly crossed. When a user's finger touches the touch panel, the in-cell touch structure in the related art can only sense the corresponding touch point but the sensitivity of pressure detection of the touch point is not easy to be improved. Therefore, the structural design of touch panel in the related art still needs to be improved.

Therefore, there is a need to provide a new touch panel to satisfy the demand of the touch panel for improving touch sensitivity.

SUMMARY

One objective of the present disclosure is to provide a touch panel that can satisfy the demand of the touch panel for improving touch sensitivity.

In order to achieve the above objective, a first embodiment of the present disclosure provides a touch panel. The touch panel comprises:
  a insulating substrate layer;
  touch drive lines comprising first touch drive line portions and second touch drive portions, an angle existing between a line direction of the first touch drive line portions and a line direction of the second touch drive line portions, the second touch drive line portions being located in a non-deformation area, spacings between two adjacent second touch drive line portions being located in a deformation area;
  touch sense lines;
  an insulating dielectric layer completely covering surfaces of the touch sense lines, surfaces of part of the touch drive lines being covered by the insulating dielectric layer, and part of surfaces of another part of the touch drive lines being not covered by the insulating dielectric layer; and
  a metal layer formed on surface portions of the touch drive lines not covered by the insulating dielectric layer and being electrically connected to the said touch drive lines, the metal layer being formed on surface portions of the insulating dielectric layer where the touch drive lines are covered by the insulating dielectric layer, the metal layer being formed on part of a surface of the insulating substrate layer not covered by the insulating substrate layer.

According to an embodiment of the present disclosure, each of the touch sense lines is an elongated structure in parallel with an extension direction of the touch drive lines, the first touch drive line portions are in parallel with an extension direction of the touch sense lines, and the second touch drive line portions are perpendicular to the extension direction of the touch sense lines.

According to an embodiment of the present disclosure, the insulating dielectric layer between the non-deformation area and the deformation area is not connected, the insulating substrate layer between the non-deformation area and the deformation area is not connected.

According to an embodiment of the present disclosure, the touch panel is a capacitive touch panel.

According to an embodiment of the present disclosure, the insulating substrate layer is formed with coating using a polyimide (PI) material.

According to an embodiment of the present disclosure, the touch drive lines and the touch sense lines are formed in a same mask process and made of indium tin oxide (ITO).

According to an embodiment of the present disclosure, the insulating dielectric layer is made of silicon nitride (SiNx).

According to an embodiment of the present disclosure, the metal layer is made of a material selected from the group consisting of titanium (Ti), aluminum (Al), molybdenum (Mo), and a combination thereof.

A second embodiment of the present disclosure provides a manufacturing method of circuit lines of a touch panel comprising:
  forming an insulating substrate layer with coating using a colorless transparent material;
  performing exposure and development processes by using a first mask to form touch drive lines and the touch sense lines, the touch drive lines comprising first touch drive line portions and second touch drive portions, an angle existing between a line direction of the first touch drive line portions and a line direction of the second touch drive line portions, the second touch drive line portions being located in a non-deformation area, spacings between two adjacent second touch drive line portions being located in a deformation area;
  performing exposure and development processes on the touch drive lines and the touch sense lines by using a second mask to form an insulating dielectric layer, the insulating dielectric layer completely covering surfaces of the touch sense lines, surfaces of part of the touch drive lines being covered by the insulating dielectric layer, and part of surfaces of another part of the touch drive lines being not covered by the insulating dielectric layer;

performing exposure and development processes on the touch drive lines and part of a surface of the insulating substrate layer by using a third mask to form a metal layer, the metal layer being formed on surface portions of the touch drive lines not covered by the insulating dielectric layer and being electrically connected to the said touch drive lines, the metal layer being formed on surface portions of the insulating dielectric layer where the touch drive lines are covered by the insulating dielectric layer, the metal layer being formed on part of the surface of the insulating substrate layer not covered by the insulating substrate layer; and performing an etch process on the insulating dielectric layer and the insulating substrate layer by using a fourth mask, so that the insulating dielectric layer between the non-deformation area and the deformation area is not connected and the insulating substrate layer between the non-deformation area and the deformation area is not connected.

According to an embodiment of the present disclosure, each of the touch sense lines is an elongated structure in parallel with an extension direction of the touch drive lines, the first touch drive line portions are in parallel with an extension direction of the touch sense lines, and the second touch drive line portions are perpendicular to the extension direction of the touch sense lines.

According to an embodiment of the present disclosure, the insulating dielectric layer between the non-deformation area and the deformation area is not connected, the insulating substrate layer between the non-deformation area and the deformation area is not connected.

According to an embodiment of the present disclosure, the touch panel is a capacitive touch panel.

According to an embodiment of the present disclosure, the insulating substrate layer is formed with coating using a polyimide (PI) material.

According to an embodiment of the present disclosure, the touch drive lines and the touch sense lines are formed in a same mask process and made of indium tin oxide (ITO).

According to an embodiment of the present disclosure, the insulating dielectric layer is made of silicon nitride (SiNx).

According to an embodiment of the present disclosure, the metal layer is made of a material selected from the group consisting of titanium (Ti), aluminum (Al), molybdenum (Mo), and a combination thereof.

The beneficial effects of the embodiments of the present disclosure are as follows. The touch drive lines of the touch panel according to the embodiment of the present disclosure adopt a segmented structure design, and the metal layer is designed as an "S" shape or other curved structure in the segment spacing (deformation area) of the touch drive lines. The film layer structure in the deformation area is the insulating substrate layer and the metal layer, so that deformation occurs easily. In addition, the area of the touch drive lines and the touch sense lines covered by the insulating dielectric layer is not easily deformed due to the higher rigidity. Therefore, when a user's finger touches the touch panel to generate a pressure, the segment gaps (deformation area) of the touch drive lines are deformed under the effect of the pressure. However, the touch sense lines are not easily deformed due to their higher rigidity. As a result, spacings between the touch drive lines and the touch sense lines are changed, and changes of the spacings cause changes of capacitance values between the touch drive lines and the touch sense lines. Through detecting an amount of change of the capacitance value, a magnitude of a user's pressing force is determined to make a further judgment as to whether it is a "light press" or a "heavy press" so as to retrieve a corresponding instruction. The touch panel according to the embodiment of the present disclosure can improve the sensitivity of touch pressure detection so as to realize the requirement of providing more touch functions. In addition, only four masks are needed to fabricate the related structure of the touch circuit lines according to the embodiment of the present disclosure. The manufacturing process is relatively simple to reduce the manufacturing cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
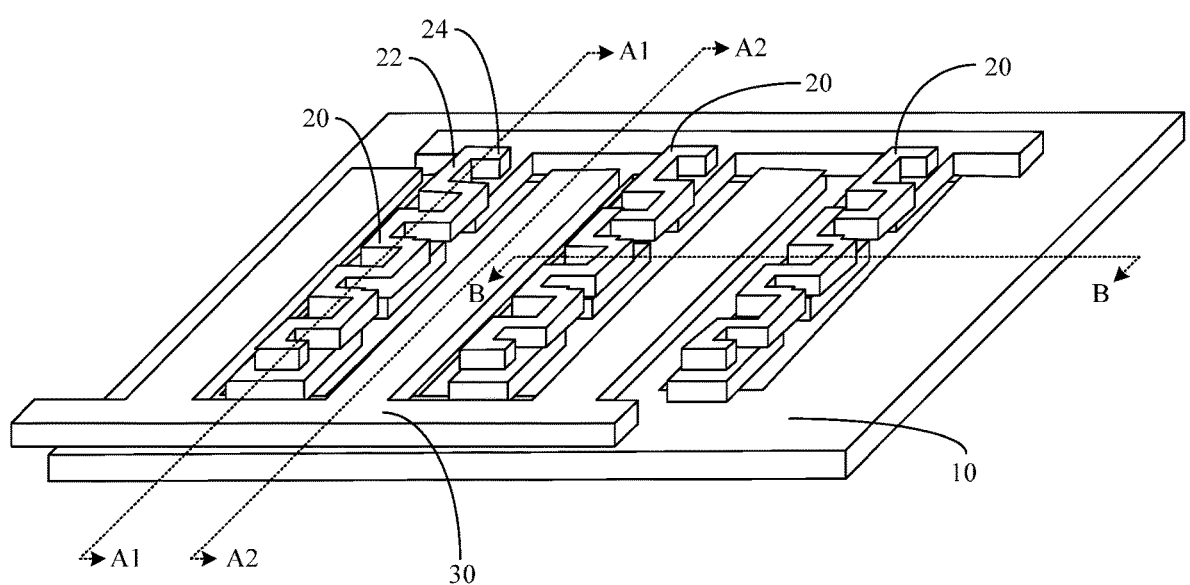
FIG. 1 is a structural schematic diagram of a touch panel according to one embodiment of the present disclosure.

FIG. 1 is a structural schematic diagram of a touch panel according to one embodiment of the present disclosure. As shown in FIG. 1, the touch panel mainly comprises an insulating substrate layer 10, touch drive lines (Tx Line) 20, and touch sense lines (Rx Line) 30. The touch panel according to the embodiment of the present disclosure is a capacitive touch panel, and its detailed touch principle is described as follows. First, a finger touches the touch panel to generate a pressure. Under the effect of the pressure, gaps between the touch drive lines 20 are deformed, but the touch sense lines 30 are not easily deformed due to their higher rigidity. As a result, spacings between the touch drive lines 20 and the touch sense lines 30 are changed. Because the touch drive lines 20, the touch sense lines 30, and an insulating dielectric layer between the two form capacitor structures, changes of the spacings cause changes of capacitance values between the touch drive lines 20 and the touch sense lines 30. Through detecting an amount of change of the capacitance value, a magnitude of a user's pressing force is determined to make a further judgment as to whether it is a "light press" or a "heavy press" so as to retrieve a corresponding instruction. The insulating substrate layer 10 may be formed with coating using a colorless transparent polyimide (PI) material. The touch drive lines 20 and the touch sense lines 30 may be made of a highly transparent conductive film material, such as indium tin oxide (ITO), a nano-silver film material, or the like. The insulating dielectric layer between the touch drive lines 20 and the touch sense lines 30 may be made of a polymer dielectric film material, such as silicon nitride (SiNx).

Figure 2:
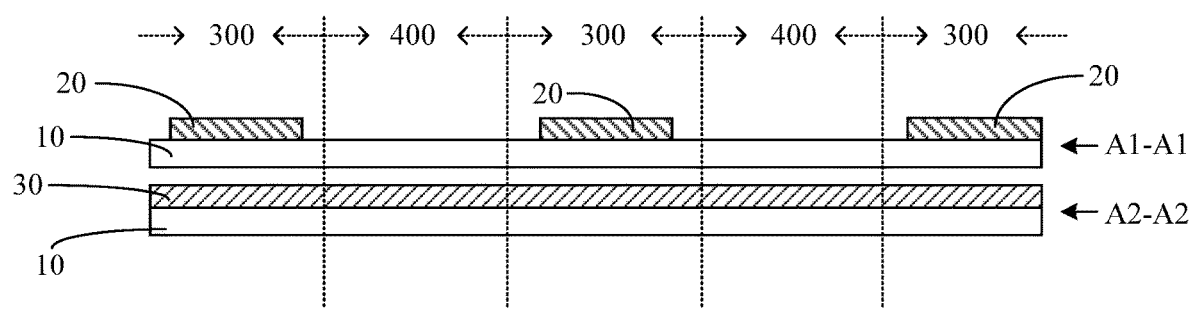
FIG. 2 is a cross-sectional schematic diagram of a touch panel taken along line A1-A1 and line A2-A2 in a first mask process according to one embodiment of the present disclosure.
Figure 3:
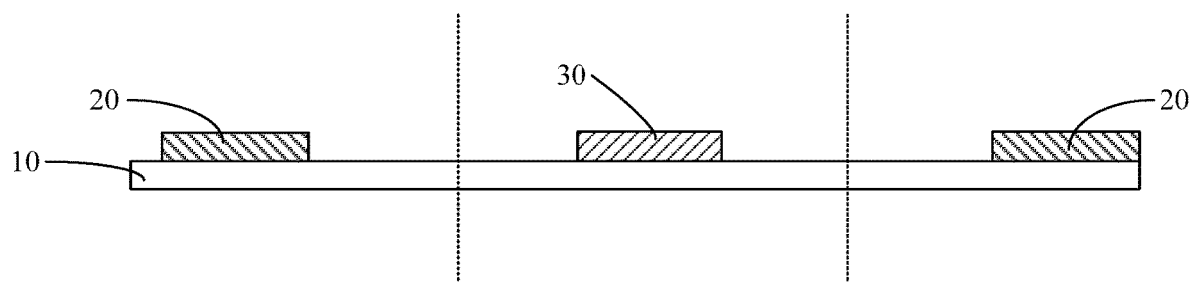
FIG. 3 is a cross-sectional schematic diagram of a touch panel taken along line B-B in a first mask process according to one embodiment of the present disclosure.

A description is provided with reference to FIG. 2 and FIG. 3. FIG. 2 is a cross-sectional schematic diagram of the touch drive lines 20 and the touch sense lines 30 of the touch panel shown in FIG. 1 taken along line A1-A1 and line A2-A2 in a first mask process. FIG. 3 is a cross-sectional schematic diagram of the touch panel shown in FIG. 1 taken along line B-B in the first mask process. Exposure and development processes are performed on the insulating substrate layer 10 by using a first mask to form the touch drive lines 20 and the touch sense lines 30. Each of the touch drive lines 20 has an S-shaped structure when viewed from the top, and each of the touch sense lines 30 is an elongated structure in parallel with an extension direction of the touch drive lines 20. Each of the touch drive lines 20 comprises first touch drive line portions 22 in parallel with an extension direction of the touch sense lines 30 and second touch drive line portions 24 perpendicular to the extension direction of the touch sense lines 30. The second touch drive line portions 24 not parallel with the extension direction of the touch sense lines 30 are located in a non-deformation area 300, and spacings between the second touch drive line portions 24 not parallel with the extension direction of the touch sense lines 30 are located in a deformation area 400. In the present embodiment, each of the touch drive lines 20 has the S-shaped structure. However, each of the touch drive lines 20 may have structures in other similar shapes, such as a structure in an "E" shape, in an "M" shape, in an "N" shape, in a "Z" shape, or the like, or have structures in different shapes in combination.

Figure 4:
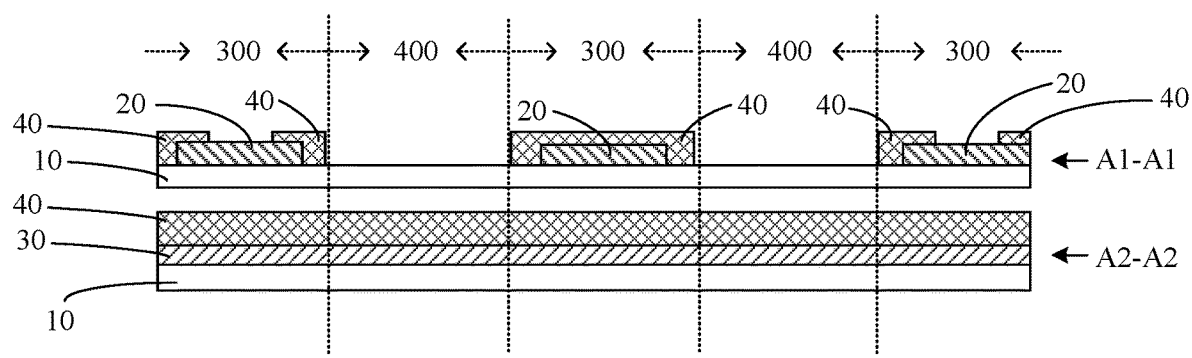
FIG. 4 is a cross-sectional schematic diagram of a touch panel taken along line A1-A1 and line A2-A2 in a second mask process according to one embodiment of the present disclosure.
Figure 5:
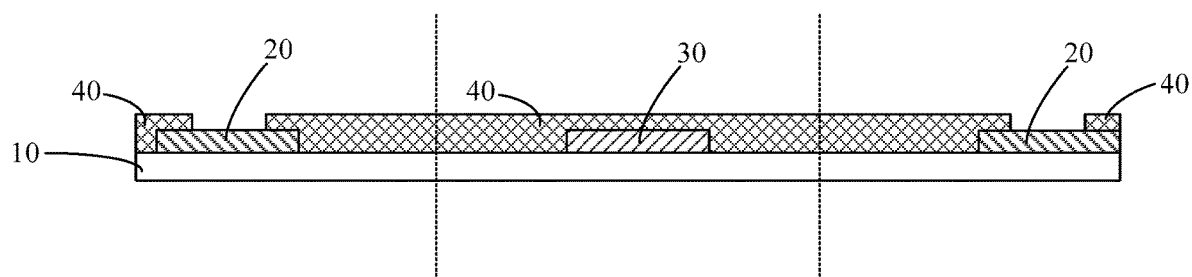
FIG. 5 is a cross-sectional schematic diagram of a touch panel taken along line B-B in a second mask process according to one embodiment of the present disclosure.

A description is provided with reference to FIG. 4 and FIG. 5. FIG. 4 is a cross-sectional schematic diagram of the touch drive lines 20 and the touch sense lines 30 of the touch panel shown in FIG. 1 taken along line A1-A1 and line A2-A2 in a second mask process. FIG. 5 is a cross-sectional schematic diagram of the touch panel shown in FIG. 1 taken along line B-B in the second mask process. Exposure and development processes are performed on the touch drive lines 20 and the touch sense lines 30 by using a second mask to form an insulating dielectric layer 40. As shown in FIG. 4, the insulating dielectric layer 40 completely covers surfaces of the touch sense lines 30. Surfaces of part of the touch drive lines 20 are covered by the insulating dielectric layer 40, and part of surfaces of another part of the touch drive lines 20 are not covered by the insulating dielectric layer 40. The insulating dielectric layer 40 may be made of silicon nitride.

Figure 6:
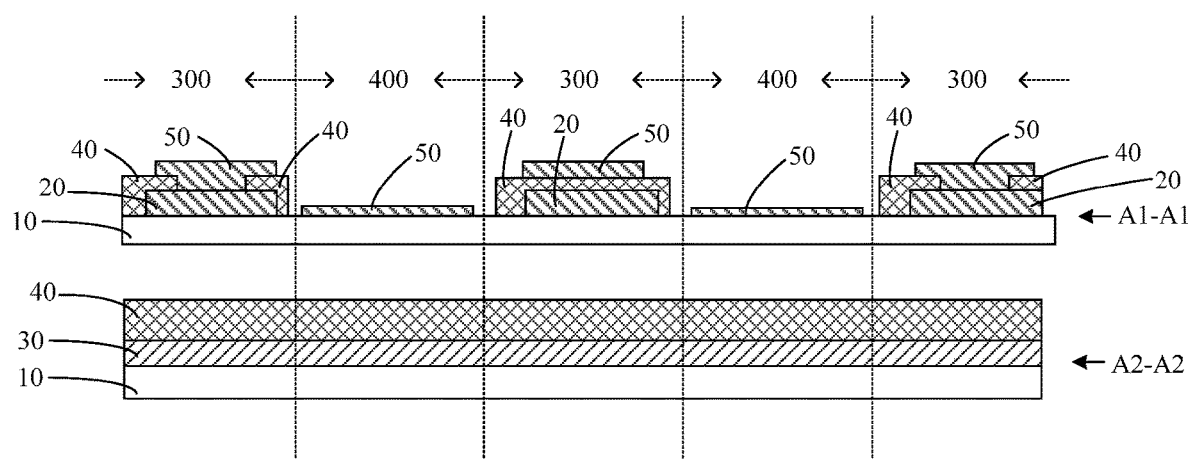
FIG. 6 is a cross-sectional schematic diagram of a touch panel taken along line A1-A1 and line A2-A2 in a third mask process according to one embodiment of the present disclosure.
Figure 7:
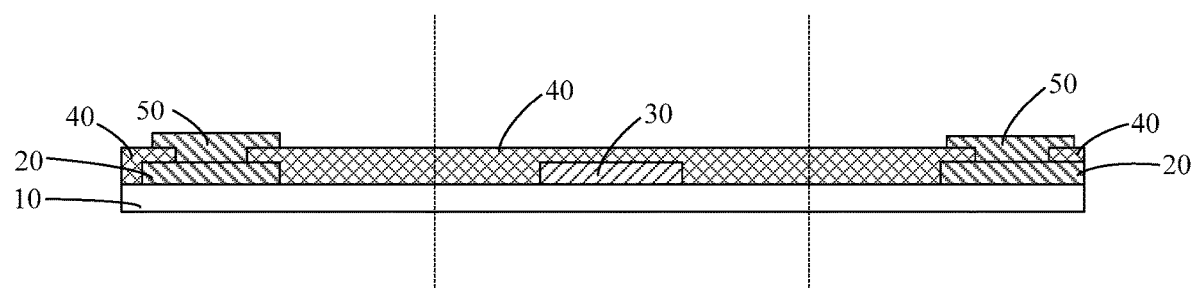
FIG. 7 is a cross-sectional schematic diagram of a touch panel taken along line B-B in a third mask process according to one embodiment of the present disclosure.

A description is provided with reference to FIG. 6 and FIG. 7. FIG. 6 is a cross-sectional schematic diagram of the touch drive lines 20 and the touch sense lines 30 of the touch panel shown in FIG. 1 taken along line A1-A1 and line A2-A2 in a third mask process. FIG. 7 is a cross-sectional schematic diagram of the touch panel shown in FIG. 1 taken along line B-B in the third mask process. Exposure and development processes are performed on the touch drive lines 20 and part of a surface of the insulating substrate layer 10 by using a third mask to form a metal layer 50. The metal layer 50 is electrically connected to the touch drive lines 20 at surface portions of the touch drive lines 20 not covered by the insulating dielectric layer 40. The metal layer 50 is formed on the insulating dielectric layer 40 on surface portions of the touch drive lines 20 covered by the insulating dielectric layer 40. At the same time, the metal layer 50 is formed on part of the surface of the insulating substrate layer 10 not covered by the insulating substrate layer 10. The metal layer 50 may be made of a metal material, such as titanium (Ti), aluminum (Al), molybdenum (Mo), or a combination thereof.

Figure 8:
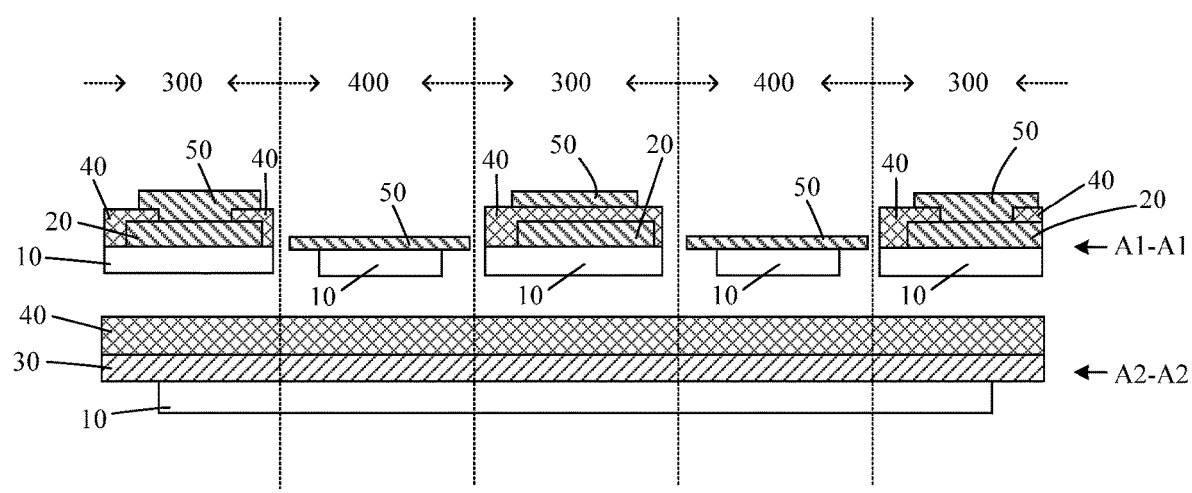
FIG. 8 is a cross-sectional schematic diagram of a touch panel taken along line A1-A1 and line A2-A2 in a fourth mask process according to one embodiment of the present disclosure.
Figure 9:
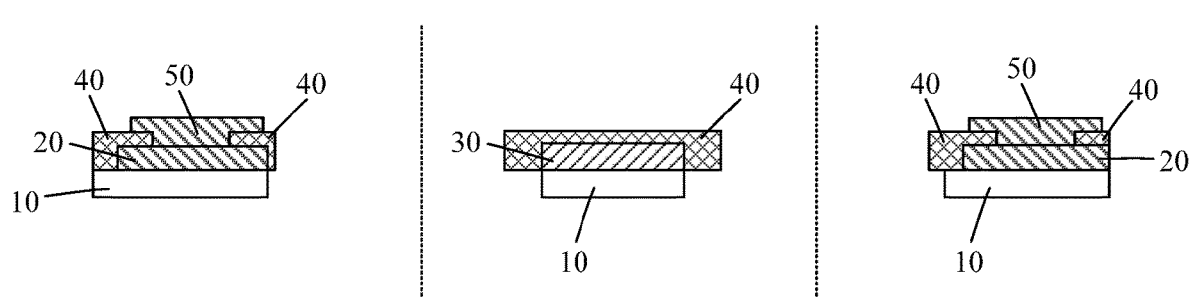
FIG. 9 is a cross-sectional schematic diagram of a touch panel taken along line B-B in a fourth mask process according to one embodiment of the present disclosure.

A description is provided with reference to FIG. 8 and FIG. 9. FIG. 8 is a cross-sectional schematic diagram of the touch drive lines 20 and the touch sense lines 30 of the touch panel shown in FIG. 1 taken along line A1-A1 and line A2-A2 in a fourth mask process. FIG. 9 is a cross-sectional schematic diagram of the touch panel shown in FIG. 1 taken along line B-B in the fourth mask process. An etch process is performed on the insulating dielectric layer 40 and the insulating substrate layer 10 by using a fourth mask, so that the insulating dielectric layer 40 between the non-deformation area 300 and the deformation area 400 is not connected and the insulating substrate layer 10 between the non-deformation area 300 and the deformation area 400 is not connected.

According to the embodiments of the present disclosure, the touch drive lines 20 of the touch panel adopt a segmented structure design, and the metal layer 50 is designed as an "S" shape or other curved structure in the segment spacing (deformation area) of the touch drive lines 20. The film layer structure in the deformation area 400 is the insulating substrate layer 10 and the metal layer 50, so that deformation occurs easily. In addition, the area of the touch drive lines 20 and the touch sense lines 30 covered by the insulating dielectric layer 40 is not easily deformed due to the higher rigidity. Therefore, when a user's finger touches the touch panel to generate a pressure, the segment gaps (deformation area 400) of the touch drive lines 20 are deformed under the effect of the pressure. However, the touch sense lines 30 are not easily deformed due to their higher rigidity. As a result, spacings between the touch drive lines 20 and the touch sense lines 30 are changed, and changes of the spacings cause changes of capacitance values between the touch drive lines 20 and the touch sense lines 30. Through detecting an amount of change of the capacitance value, a magnitude of a user's pressing force is determined to make a further judgment as to whether it is a "light press" or a "heavy press" so as to retrieve a corresponding instruction. The touch panel according to the embodiment of the present disclosure can improve the sensitivity of touch pressure detection so as to realize the requirement of providing more touch functions. In addition, only four masks are needed to fabricate the related structure of the touch circuit lines according to the embodiment of the present disclosure. The manufacturing process is relatively simple to reduce the manufacturing cost.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A touch panel comprising:
    a insulating substrate layer;
    touch drive lines comprising first touch drive line portions and second touch drive portions, an angle existing between a line direction of the first touch drive line portions and a line direction of the second touch drive line portions, the second touch drive line portions being located in a non-deformation area, spacings between two adjacent second touch drive line portions being located in a deformation area;
    touch sense lines;
    an insulating dielectric layer completely covering surfaces of the touch sense lines, surfaces of part of the touch drive lines being covered by the insulating dielectric layer, and part of surfaces of another part of the touch drive lines being not covered by the insulating dielectric layer; and
    a metal layer formed on surface portions of the touch drive lines not covered by the insulating dielectric layer and being electrically connected to the said touch drive lines, the metal layer being formed on surface portions of the insulating dielectric layer where the touch drive lines are covered by the insulating dielectric layer, the metal layer being formed on part of a surface of the insulating substrate layer not covered by the insulating dielectric layer.

2. The touch panel as claimed in claim 1, wherein each of the touch sense lines is an elongated structure in parallel with an extension direction of the touch drive lines, the first touch drive line portions are in parallel with an extension direction of the touch sense lines, and the second touch drive line portions are perpendicular to the extension direction of the touch sense lines.

3. The touch panel as claimed in claim 1, wherein the insulating dielectric layer between the non-deformation area and the deformation area is not connected, the insulating substrate layer between the non-deformation area and the deformation area is not connected.

4. The touch panel as claimed in claim 1, wherein the touch panel is a capacitive touch panel.

5. The touch panel as claimed in claim 1, wherein the insulating substrate layer is formed with coating using a polyimide (PI) material.

6. The touch panel as claimed in claim 1, wherein the touch drive lines and the touch sense lines are formed in a same mask process and made of indium tin oxide (ITO).

7. The touch panel as claimed in claim 1, wherein the insulating dielectric layer is made of silicon nitride (SiNx).

8. The touch panel as claimed in claim 1, wherein the metal layer is made of a material selected from the group consisting of titanium (Ti), aluminum (Al), molybdenum (Mo), and a combination thereof.

9. A manufacturing method of circuit lines of a touch panel comprising:
    forming an insulating substrate layer with coating using a colorless transparent material;
    performing exposure and development processes by using a first mask to form touch drive lines and the touch sense lines, the touch drive lines comprising first touch drive line portions and second touch drive portions, an angle existing between a line direction of the first touch drive line portions and a line direction of the second touch drive line portions, the second touch drive line portions being located in a non-deformation area, spacings between two adjacent second touch drive line portions being located in a deformation area;
    performing exposure and development processes on the touch drive lines and the touch sense lines by using a second mask to form an insulating dielectric layer, the insulating dielectric layer completely covering surfaces of the touch sense lines, surfaces of part of the touch drive lines being covered by the insulating dielectric layer, and part of surfaces of another part of the touch drive lines being not covered by the insulating dielectric layer;
    performing exposure and development processes on the touch drive lines and part of a surface of the insulating substrate layer by using a third mask to form a metal layer, the metal layer being formed on surface portions of the touch drive lines not covered by the insulating dielectric layer and being electrically connected to the said touch drive lines, the metal layer being formed on surface portions of the insulating dielectric layer where the touch drive lines are covered by the insulating dielectric layer, the metal layer being formed on part of the surface of the insulating substrate layer not covered by the insulating dielectric layer; and
    performing an etch process on the insulating dielectric layer and the insulating substrate layer by using a fourth mask, so that the insulating dielectric layer between the non-deformation area and the deformation area is not connected and the insulating substrate layer between the non-deformation area and the deformation area is not connected.

10. The manufacturing method as claimed in claim 9, wherein each of the touch sense lines is an elongated structure in parallel with an extension direction of the touch drive lines, the first touch drive line portions are in parallel with an extension direction of the touch sense lines, and the second touch drive line portions are perpendicular to the extension direction of the touch sense lines.

11. The manufacturing method as claimed in claim 9, wherein the insulating dielectric layer between the non-deformation area and the deformation area is not connected, the insulating substrate layer between the non-deformation area and the deformation area is not connected.

12. The manufacturing method as claimed in claim 9, wherein the touch panel is a capacitive touch panel.

13. The manufacturing method as claimed in claim 9, wherein the insulating substrate layer is formed with coating using a polyimide (PI) material.

14. The manufacturing method as claimed in claim 9, wherein the touch drive lines and the touch sense lines are formed in a same mask process and made of indium tin oxide (ITO).

15. The manufacturing method as claimed in claim 9, wherein the insulating dielectric layer is made of silicon nitride (SiNx).

16. The manufacturing method as claimed in claim 9, wherein the metal layer is made of a material selected from the group consisting of titanium (Ti), aluminum (Al), molybdenum (Mo), and a combination thereof.

\* \* \* \* \*